US012033950B2

United States Patent
Vincent et al.

(10) Patent No.: US 12,033,950 B2
(45) Date of Patent: Jul. 9, 2024

(54) SEMICONDUCTOR DEVICE WITH SELF-ALIGNED WAVEGUIDE AND METHOD THEREFOR

(71) Applicant: NXP USA, INC., Austin, TX (US)

(72) Inventors: Michael B. Vincent, Chandler, AZ (US); Scott M. Hayes, Chandler, AZ (US); Antonius Hendrikus Jozef Kamphuis, Nijmegen (NL)

(73) Assignee: NXP USA, Inc., Austin, TX (US)

( * ) Notice: Subject to any disclaimer, the term of this patent is extended or adjusted under 35 U.S.C. 154(b) by 300 days.

(21) Appl. No.: 17/374,039

(22) Filed: Jul. 13, 2021

(65) Prior Publication Data

US 2023/0017646 A1    Jan. 19, 2023

(51) Int. Cl.
*H01L 23/544* (2006.01)
*H01L 21/48* (2006.01)
*H01L 23/498* (2006.01)
*H01Q 1/22* (2006.01)

(52) U.S. Cl.
CPC ........ *H01L 23/544* (2013.01); *H01L 21/4853* (2013.01); *H01L 23/49838* (2013.01); *H01Q 1/2283* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 6,940,361 B1 | 9/2005 | Jokio et al. | |
| 7,978,940 B2* | 7/2011 | Steijer | B23K 1/0016 |
| | | | 385/52 |
| 9,520,635 B2 | 12/2016 | Fakharzadeh et al. | |
| 10,164,318 B2* | 12/2018 | Seok | H01Q 9/04 |
| 10,466,433 B2* | 11/2019 | Epitaux | G02B 6/4214 |
| 11,531,174 B2* | 12/2022 | Kim | G02B 6/4212 |
| 11,586,000 B2* | 2/2023 | Butler | G02B 6/3628 |
| 2013/0154091 A1 | 6/2013 | Wright et al. | |
| 2019/0230795 A1* | 7/2019 | Hossain | H05K 3/3436 |
| 2019/0326731 A1* | 10/2019 | Mathai | H01S 5/18305 |

OTHER PUBLICATIONS

Shinko Electric Industries Co., Ltd. "Device Embedded Package MCeP", https://www.shinko.co.jp/english/product/package/assembly/mcep.php,, Jun. 2021.

* cited by examiner

*Primary Examiner* — Long Pham
(74) *Attorney, Agent, or Firm* — Robert J. Amedeo

(57) ABSTRACT

A method of forming a self-aligned waveguide is provided. The method includes forming a first alignment feature on a packaged semiconductor device and a second alignment feature on a waveguide structure. A solder material is applied to the first alignment feature or the second alignment feature. The waveguide structure is placed onto the packaged semiconductor device such that the second alignment feature overlaps the first alignment feature. The solder material is reflowed to cause the waveguide structure to align with the packaged semiconductor device.

13 Claims, 14 Drawing Sheets

SEMICONDUCTOR DEVICE WITH SELF-ALIGNED WAVEGUIDE AND METHOD THEREFOR

BACKGROUND

Field

This disclosure relates generally to semiconductor device packaging, and more specifically, to a semiconductor device with self-aligned waveguide and method of forming the same.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can significantly impact the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a packaged semiconductor device with a self-aligned waveguide structure. Alignment features are formed around an outer perimeter of the top side of the packaged semiconductor device. Matching alignment features are formed on the bottom side of the waveguide structure. The alignment features are located with predetermined relationships to signal launchers of the packaged semiconductor device and waveguides of the waveguide structure. For example, the alignment features are formed in the same processing step as the signal launchers, controlling the location accuracy within the packaged semiconductor device. The alignment features are formed as one or more metal pads having a solderable surface. A solder material (e.g., solder paste, solder balls) is applied to the alignment features of the packaged semiconductor device or the waveguide structure, and the waveguide structure is coarsely aligned with the packaged semiconductor device. During a reflow process, the solder material wets the alignment features causing the waveguide structure to finely self-align with the packaged semiconductor device. Accordingly, the waveguides are brought into precise alignment with the signal launchers as a result of the self-align process. A solder bond at the alignment features affixes the waveguide structure onto the packaged semiconductor device thus forming an assembly. Because the waveguides and the signal launchers of the assembly are brought into precise self-alignment by way of the reflow process, improvements in performance, accuracy, reliability, and overall device costs can be realized.

Figure 1:
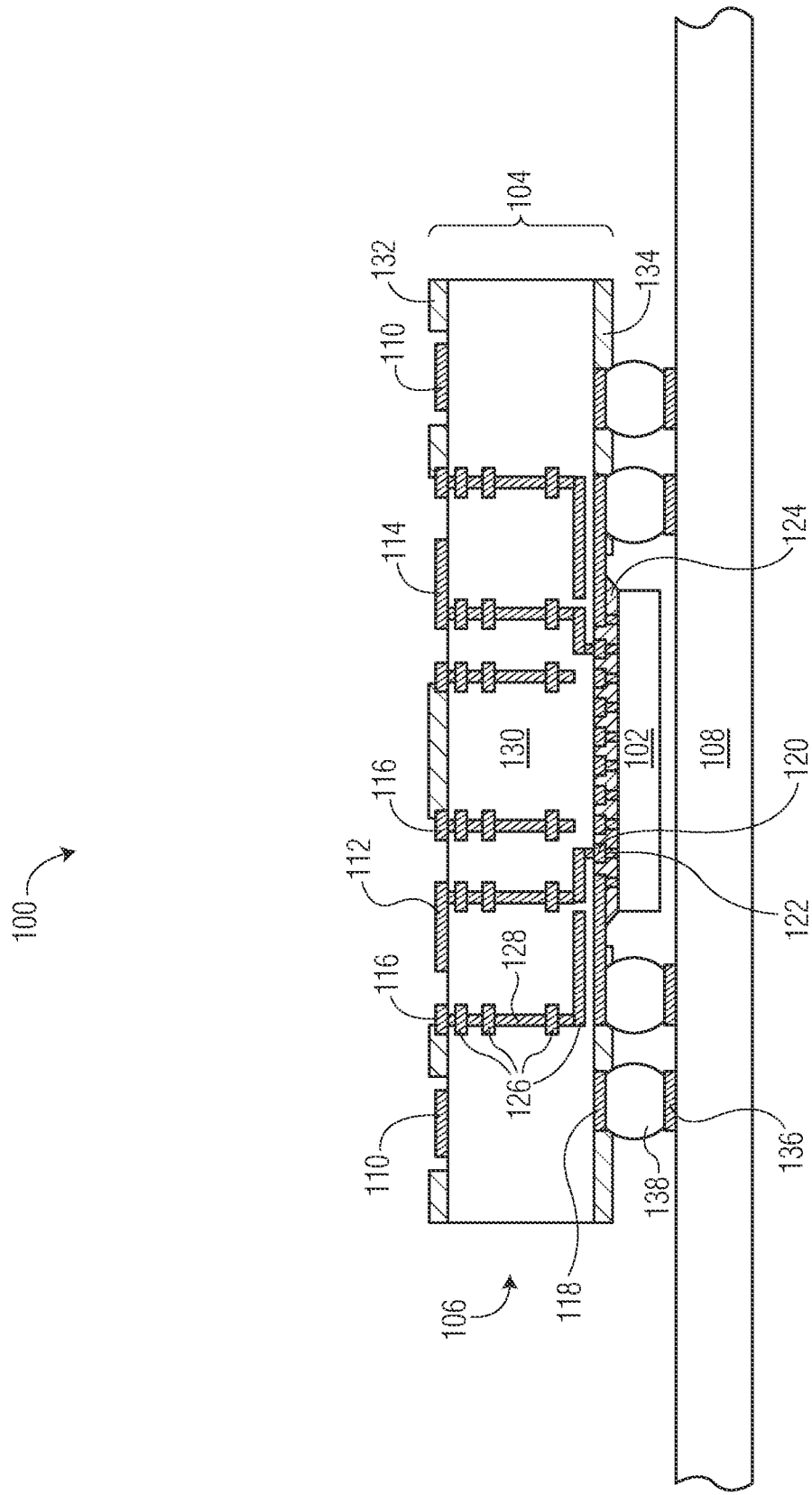
FIG. 1 through FIG. 7 illustrate, in simplified cross-sectional views, an example assembly of a packaged semiconductor device and self-aligned waveguide at stages of manufacture in accordance with an embodiment.

FIG. 1 illustrates, in a simplified cross-sectional view, an example assembly 100 of a packaged semiconductor device and self-aligned waveguide at a stage of manufacture in accordance with an embodiment. At this stage, the assembly 100 includes packaged semiconductor device 106 mounted onto a printed circuit board (PCB) substrate 108. In this embodiment, the packaged semiconductor device 106 includes a semiconductor die 102 affixed on a package substrate 104 and interconnected to the PCB substrate 108 by way of conductive connectors 138. The semiconductor die 102 is affixed at a bottom side of the package substrate 104 by way of conductive die connectors 122 and conductive die connector pads 120. The die connectors 122 may be any suitable die connector structure such as solder bumps, gold studs, copper pillars, and the like. The region between the semiconductor die 102 and the package substrate 104 is underfilled with an epoxy material 124. In this embodiment, the packaged semiconductor device 106 is depicted as an example ball grid array (BGA) package type having an undermounted semiconductor die 102. In other embodiments, other package configuration types (e.g., wafer-level packaging) are anticipated by this disclosure.

The semiconductor die 102 has an active side (e.g., major side having circuitry) and a backside (e.g., major side opposite of the active side). The semiconductor die 102 includes bond pads (not shown) at the active side configured for connection to the package substrate 104 by way of the conductive die connectors 122, for example. In this embodiment, the semiconductor die 102 is configured in a flip-chip orientation having the active side mounted on the bottom side of the package substrate 104. The semiconductor die 102 may be formed from any suitable semiconductor material, such as silicon, germanium, gallium arsenide, gallium nitride, and the like. The semiconductor die 102 may further include any digital circuits, analog circuits, RF circuits, memory, processor, the like, and combinations thereof at the active side.

The package substrate 104 has a top side and a bottom side (e.g., major side opposite of the top side). In this embodiment, the package substrate 104 is formed as a multilayer laminate structure having conductive (e.g., metal) layers patterned to form conductive features such as interconnect traces 126, alignment features 110, signal launchers 112 and 114, surrounding ring 116, connector pads 118, and die connector pads 120. In this embodiment, the alignment features 110 are formed in the same processing step as the signal launchers 112 and 114, allowing for accurate control of the locations of the alignment features relative to the signal launchers. The conductive layers are separated from each another by a non-conductive material 130 (e.g., FR-4). Vias 128 provide conductive connections between the conductive features formed from the conductive layers of the package substrate 104. The connector pads 118 located at the bottom side of the package substrate 104 are connected to corresponding PCB pads 136 of the PCB substrate 108 by way of the conductive connectors 138, for example. A first non-conductive (e.g., solder mask) material 132 is formed as a layer on the top side of the package substrate 104. The non-conductive material 132 is patterned to form openings around the signal launchers 112 and 114 and around the alignment features 110 such that the signal launchers and alignment features are exposed and substantially surrounded by the non-conductive material 132. A second non-conductive (e.g., solder mask) material 134 is formed as a layer on the bottom side of the package substrate 104. The non-conductive material 134 is patterned to form openings around the region where the semiconductor die 102 is affixed to the package substrate 104 and around connector pads 118 such that the connector pads are exposed.

Figure 13:
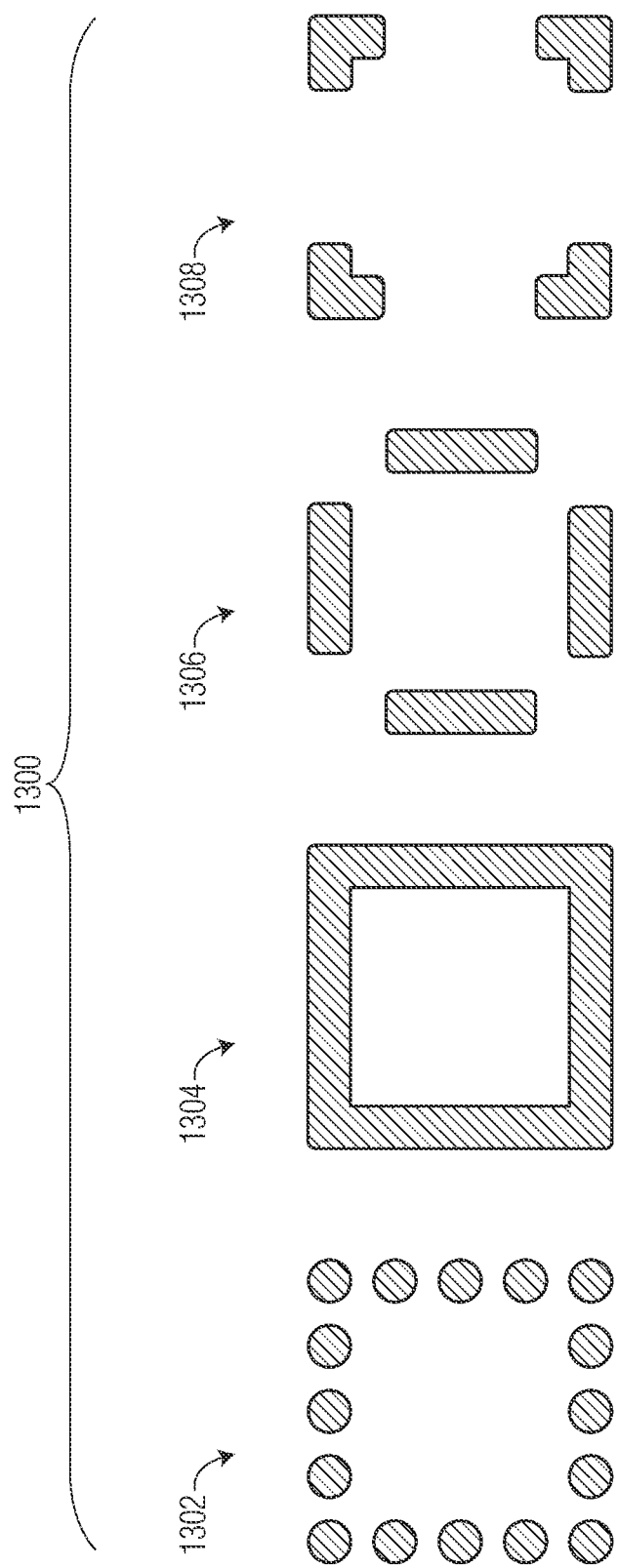
FIG. 13 illustrates, in a simplified plan view, example alignment feature configurations in accordance with an embodiment.

In this embodiment, the alignment features 110 are formed around an outer perimeter of the top side of the package substrate 104. The alignment features 110 are formed as one or more metal pads having a solderable surface. The alignment features 110 may be formed as one continuous pad or a plurality of pad segments distributed around the outer perimeter. Plan views of example alignment features 110 are depicted in FIG. 13. The alignment features 110 are configured for self-aligning in conjunction with corresponding alignment features formed on the waveguide structure. The alignment features 110 are located having a predetermined relationship with the location of the signal launchers 112 and 114. For example, when the alignment features 110 are bonded (e.g., by way of reflowed solder) with the corresponding alignment features of the waveguide structure, the signal launchers are properly aligned with corresponding waveguides of the waveguide structure. The term properly aligned, as used herein, refers to alignment within a predetermined tolerance.

The semiconductor die 102 is interconnected with the signal launchers 112 and 114 by way of the conductive features of the package substrate 104. In this embodiment, the signal launchers 112 and 114 are configured for propagation of radio frequency (RF) signals such as radar, Wi-Fi, UWB, 5G and 6G signals, for example. The conductive surrounding ring 116 of the package substrate 104 and underlying conductive traces 126 and vias 128 are configured and arranged to form a vertical conductive structure (e.g., wall, fence) connected around a perimeter of a conductive layer portion configured as a signal reflector. The vertical conductive structure substantially surrounds the signal launcher 112 and serves as a waveguide cavity in the package substrate 104, for example.

Figure 2:
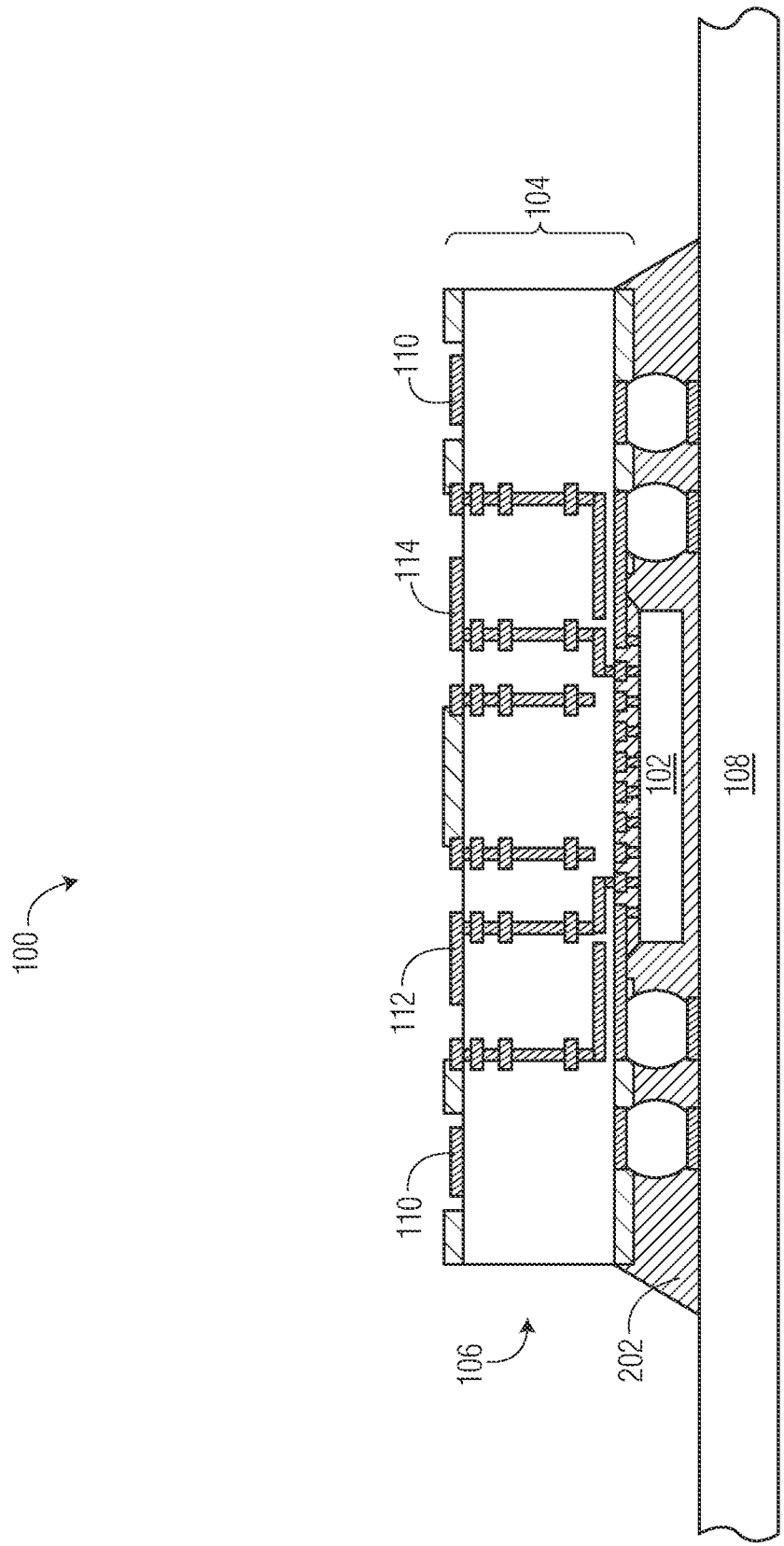

FIG. 2 illustrates, in a simplified cross-sectional view, the example assembly 100 of the packaged semiconductor device and self-aligned waveguide at a subsequent stage of manufacture in accordance with an embodiment. At this stage, the assembly 100 includes the packaged semiconductor device 106 mounted onto the PCB substrate 108 and underfilled. For example, after affixing the packaged semiconductor device 106 onto the PCB substrate 108, the region between the package substrate 104 and the PCB substrate 108 may be underfilled with an epoxy material 202.

Figure 3:
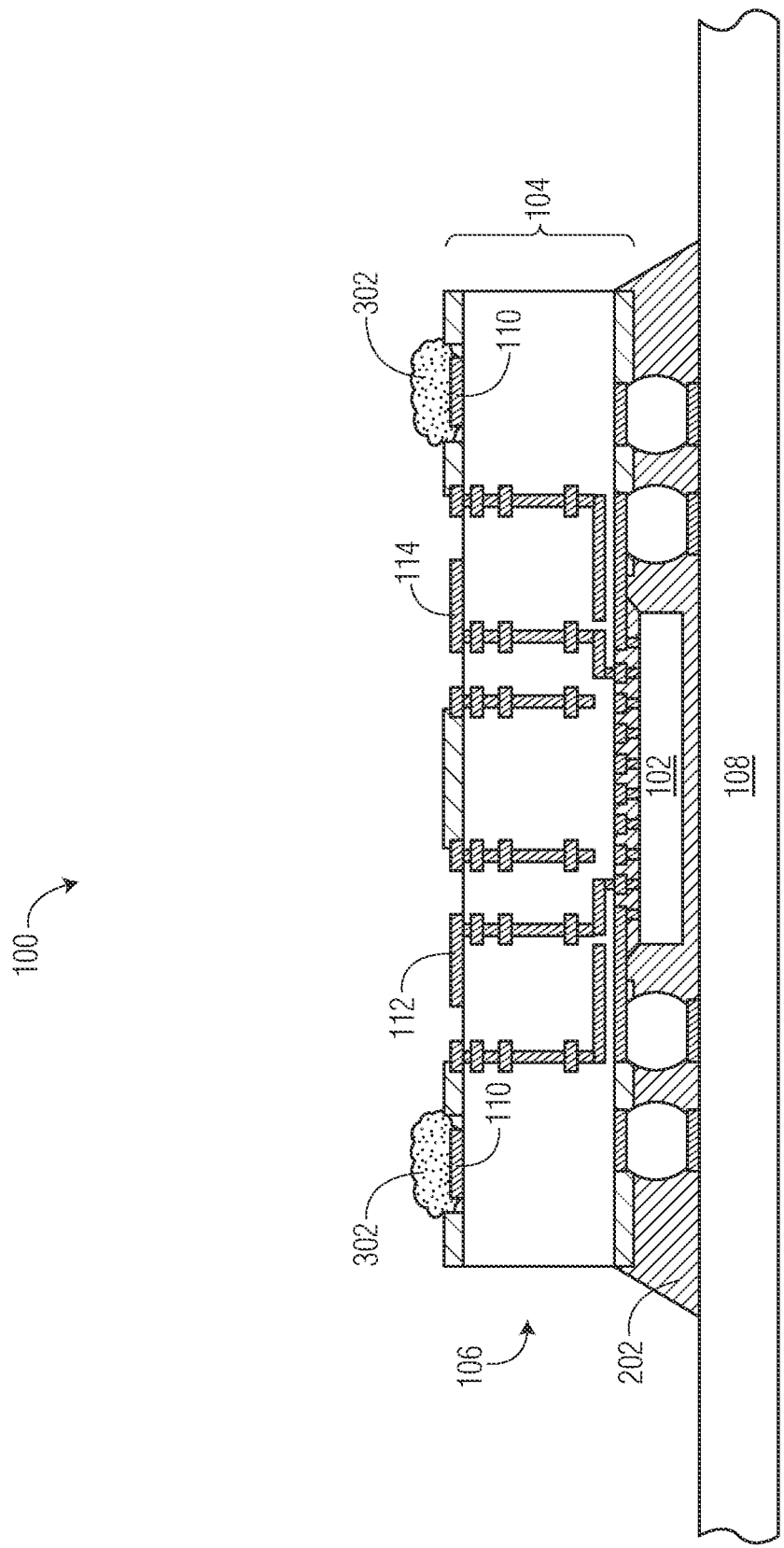

FIG. 3 illustrates, in a simplified cross-sectional view, the example assembly 100 of the packaged semiconductor device and self-aligned waveguide at a subsequent stage of manufacture in accordance with an embodiment. At this stage, a solder material in the form of a solder paste 302 is applied onto the alignment features 110 of the packaged semiconductor device 106. The solder paste 302 may be stencil printed onto the alignment features 110, for example. In this embodiment, the solder paste 302 includes a combination of solder particles and a solder flux material. The solder particles may include a mixture of tin, copper, and other metals, for example.

Figure 4:
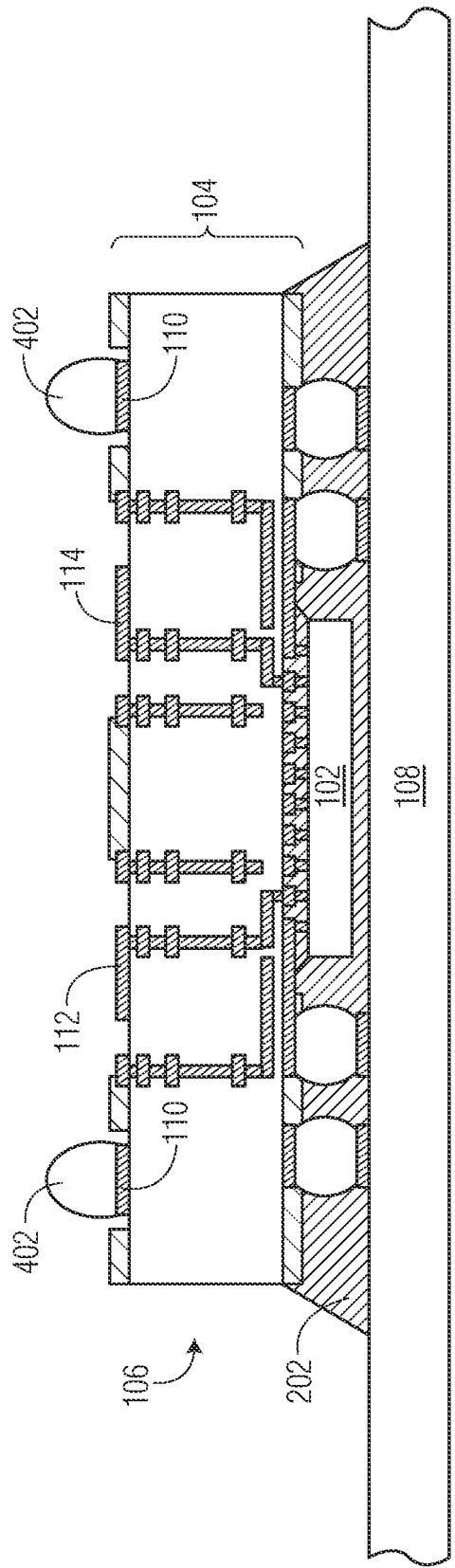

FIG. 4 illustrates, in a simplified cross-sectional view, the example assembly 100 of the packaged semiconductor device and self-aligned waveguide at an alternative stage of manufacture in accordance with an embodiment. The embodiment depicted in FIG. 4 may be an alternative to the embodiment depicted in FIG. 3. At this stage, solder material in the form of solder balls 402 is applied onto the alignment features 110 of the packaged semiconductor device 106. The solder balls 402 may be formed as balls of solder or a core material (e.g., copper) coated with solder. In this embodiment, the solder balls 402 serve as an alternative solder material depicted as a solder paste 302 in FIG. 3, for example.

Figure 5:
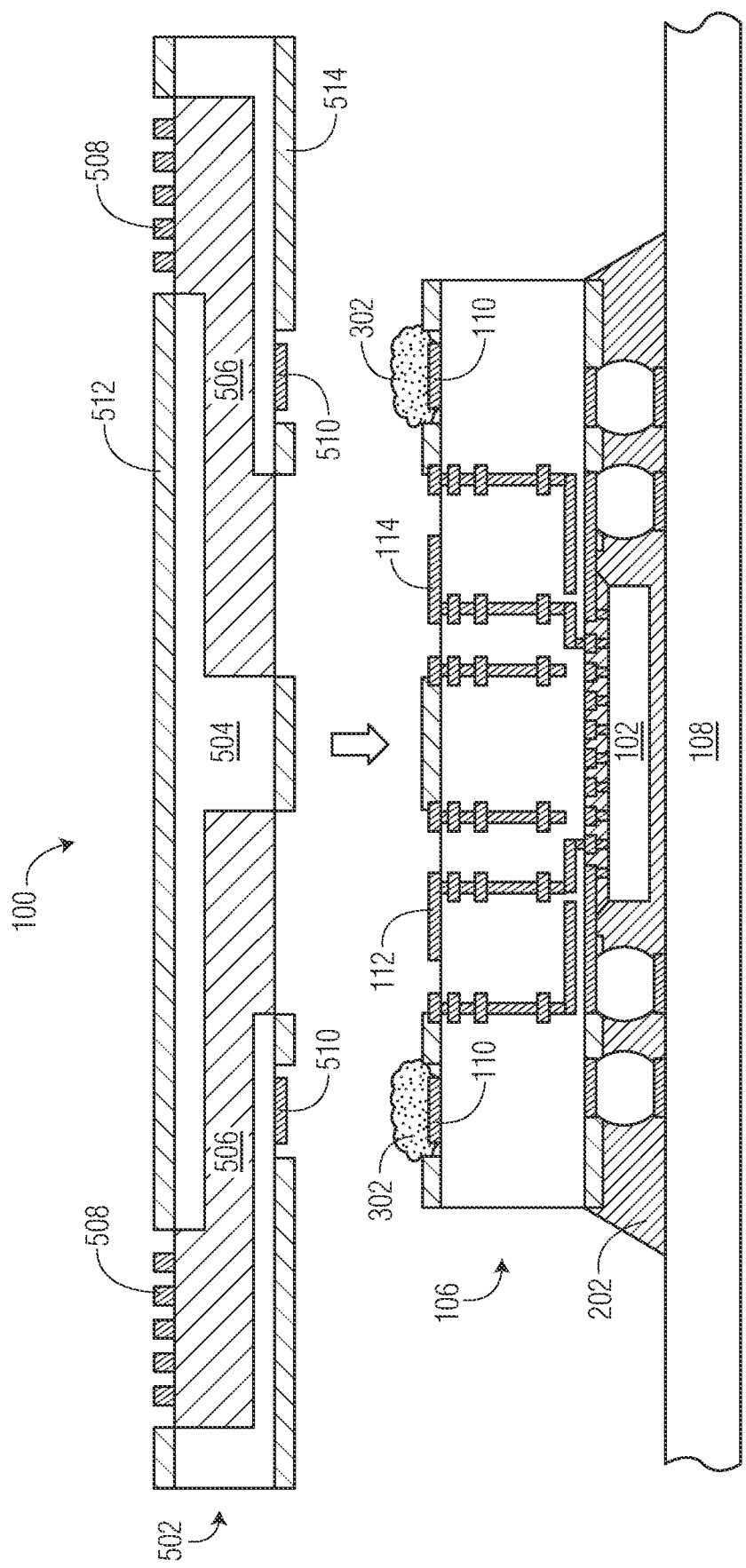

FIG. 5 illustrates, in a simplified cross-sectional view, the example assembly 100 of the packaged semiconductor device and self-aligned waveguide at a subsequent stage of manufacture in accordance with an embodiment. At this stage, the assembly 100 includes a waveguide structure 502 positioned over the packaged semiconductor device 106. The waveguide structure 502 includes waveguides 506 formed in a waveguide body 504. Waveguide antennas 508 are formed at the top of the waveguides 506. In this embodiment, the waveguide structure 502 may be characterized as a substrate integrated waveguide antenna. For example, the waveguide body 504 may be formed from a laminate material and the waveguides 506 may be formed from a dielectric material. In some embodiments, a metal lining layer (not shown) may be formed on sidewall surfaces of the waveguides 506. A first non-conductive (e.g., solder mask) material 512 is formed as a layer on the top side of the waveguide structure 502. The non-conductive material 512 is patterned to form openings such that the waveguide antennas 508 are exposed and substantially surrounded by the non-conductive material 512. A second non-conductive (e.g., solder mask) material 514 is formed as a layer on the bottom side of the waveguide structure 502. The non-conductive material 514 is patterned to form openings such that the waveguides 506 and alignment features 510 are exposed and substantially surrounded by the non-conductive material 514.

The waveguide alignment features 510 are formed on the bottom side of the waveguide body 504 to facilitate alignment with the packaged semiconductor device 106. In this embodiment, the alignment features 510 are formed to correspond with the alignment features 110 of the packaged semiconductor device 106. For example, the alignment features 510 are formed as one or more metal pads having a solderable surface. The alignment features 510 may be formed as one continuous pad or a plurality of pad segments distributed around a perimeter. In this embodiment, it may be desirable for the waveguide alignment features 510 to be formed from similar surface materials and have similar shapes and sizes as the alignment features 110 of the packaged semiconductor device 106. The alignment features 510 are configured for self-aligning in conjunction with corresponding alignment features 110 formed on the packaged semiconductor device 106. The waveguide alignment features 510 are located having a predetermined relationship with the location of the waveguides 506. For example, when the alignment features 510 are bonded (e.g., by way of reflowed solder) with the corresponding alignment features 110 of the packaged semiconductor device 106, the waveguides 506 are properly aligned with corresponding signal launchers 112 and 114.

Figure 6:
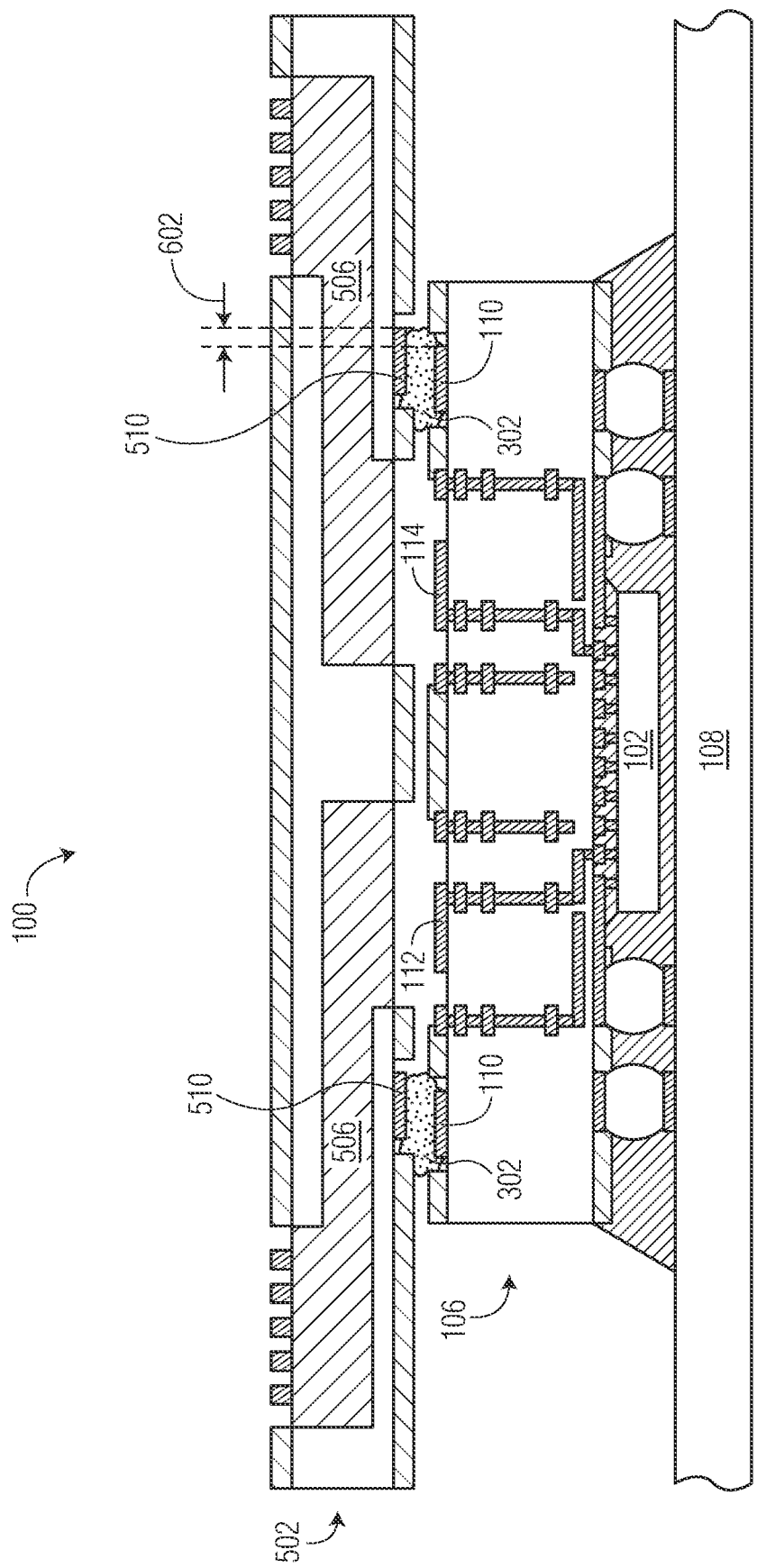

FIG. 6 illustrates, in a simplified cross-sectional view, the example assembly 100 of the packaged semiconductor device and self-aligned waveguide at a subsequent stage of manufacture in accordance with an embodiment. At this stage, the assembly 100 includes the waveguide structure 502 coarsely aligned and placed onto the packaged semiconductor device 106. A course alignment offset amount 602 is depicted with respective dashed lines. In this embodiment, it is desirable for the coarse alignment offset of the waveguide alignment feature 510 to be within half of the width of the alignment feature 110. For example, if the cross-sectional width of the alignment feature 110 is 500 microns, it is desirable for waveguide alignment feature 510 center to be within 250 microns of the alignment feature 110 center when coarsely aligned.

Figure 7:
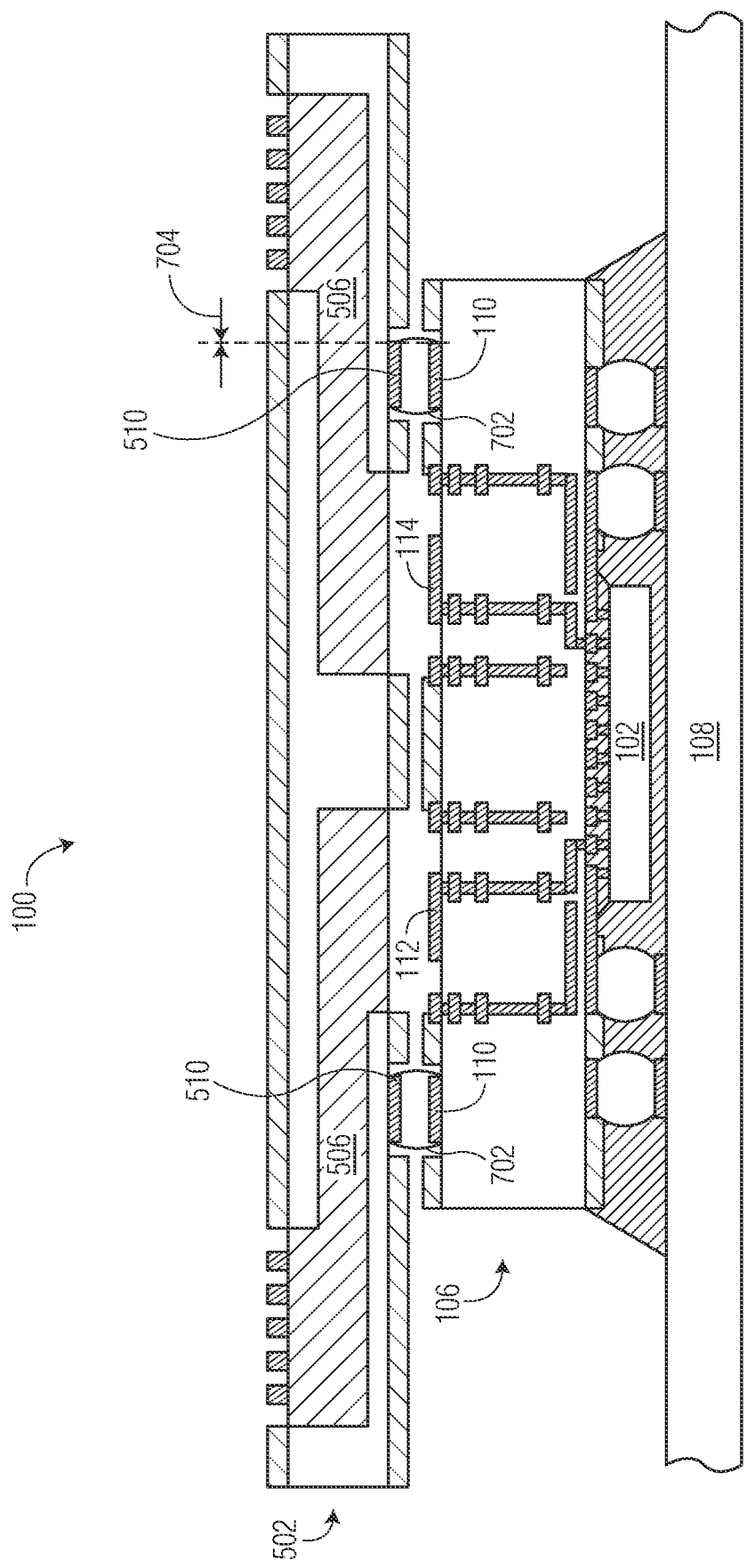

FIG. 7 illustrates, in a simplified cross-sectional view, the example assembly 100 of the packaged semiconductor device and self-aligned waveguide at a subsequent stage of manufacture in accordance with an embodiment. At this stage, the assembly 100 includes the waveguide structure 502 finely aligned with the packaged semiconductor device 106 after reflow of the solder material (302). Solid solder bonds 702 are formed between the alignment features 110 and the waveguide alignment features 510 properly aligning signal launchers 112 and 114 with respective waveguides (506). A fine alignment offset amount 704 is depicted with respective dashed line.

In this embodiment, a solder reflow process is used to bring the waveguide structure 502 (e.g., alignment features 510) into fine two-dimensional (e.g., X-Y) alignment with the packaged semiconductor device 106 (e.g., alignment features 110) causing the waveguides 506 to be properly aligned with respective signal launchers 112 and 114. As the solder reflows and wets the top and side surfaces of the alignment features 110 and 510, coarse alignment offset (602) is corrected by the wetting forces of the solder. This self-aligning process allows for the waveguide structure 502 to be finely aligned with the packaged semiconductor device 106 within a predetermined tolerance. Reflowing the solder material causes the waveguide structure to align with the packaged semiconductor device within a predetermined tolerance (e.g., within 25% of the cross-sectional width of the alignment features 110 and 510).

Figure 8:
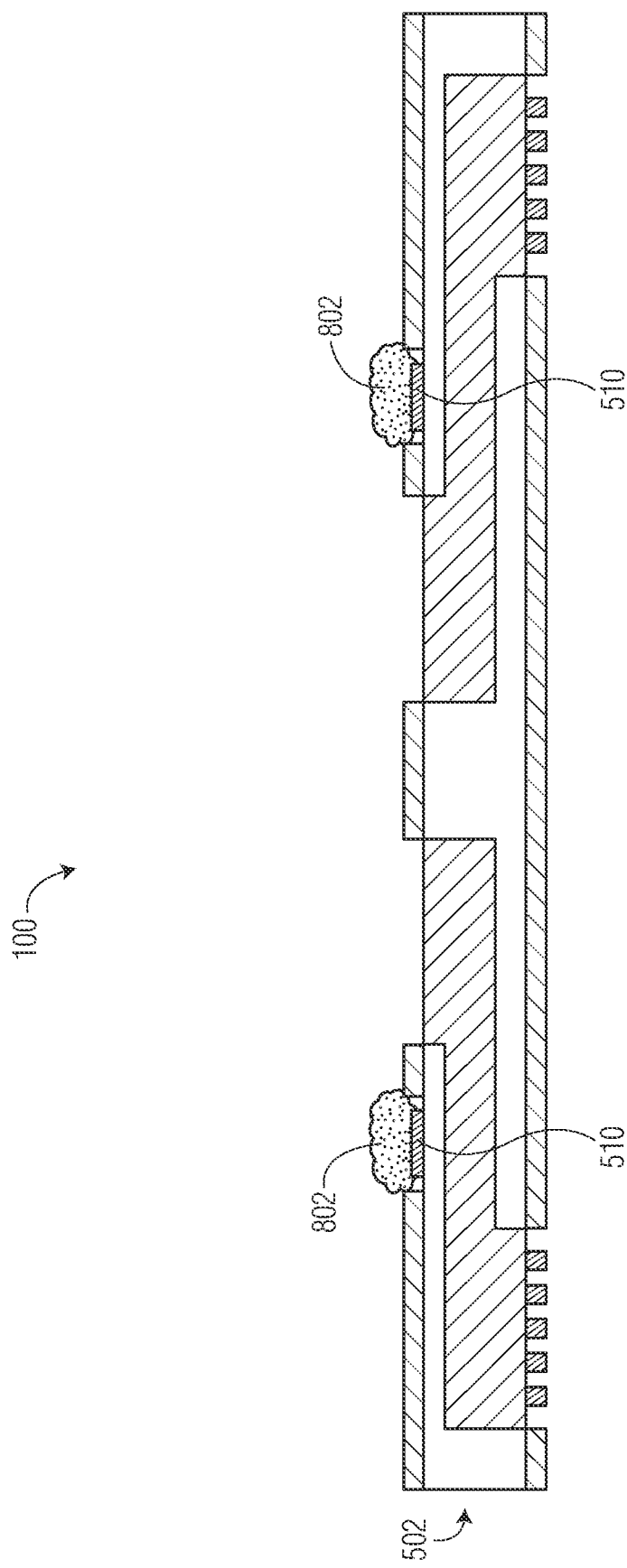
FIG. 8 and FIG. 9 illustrate, in simplified cross-sectional views, the example assembly of the packaged semiconductor device and self-aligned waveguide at alternative stages of manufacture in accordance with an embodiment.
Figure 9:
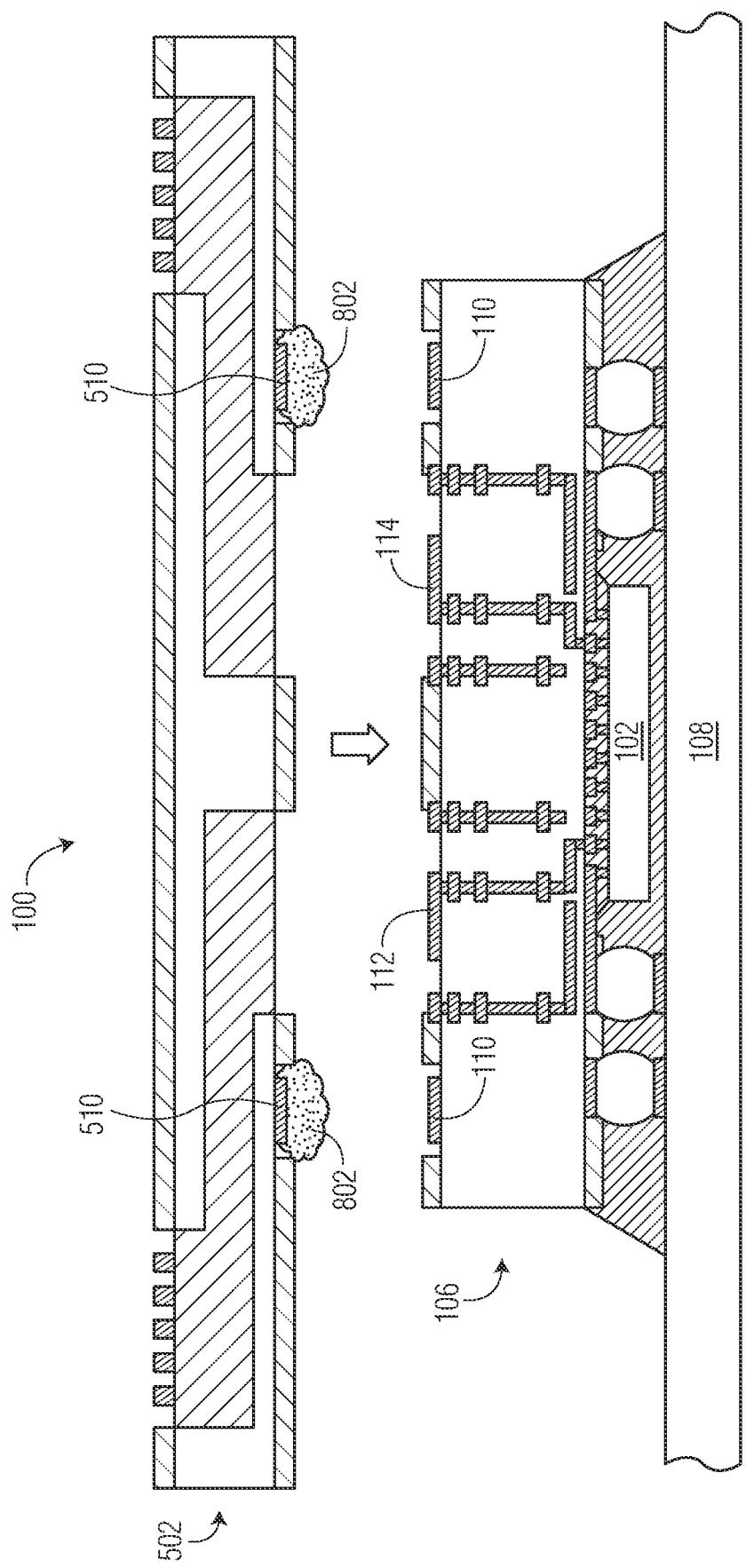

FIG. 8 and FIG. 9 illustrate, in simplified cross-sectional views, the example assembly 100 of the packaged semiconductor device 106 and self-aligned waveguide 502 at alternative stages of manufacture in accordance with an embodiment. The stages of manufacture of the embodiment depicted in FIG. 8 and FIG. 9 are subsequent to the stage of manufacture depicted in FIG. 2 and are alternatives to the embodiment depicted in FIG. 3 through FIG. 5, for example. In this embodiment, a solder material 802 (e.g., solder paste, solder balls) is applied onto the alignment features 510 of the waveguide structure 502 as an alternative to applying the solder material 302 onto the alignment features 110 of the packaged semiconductor device 106 depicted in FIG. 3. After the solder material 802 is applied onto the alignment features 510 of the waveguide structure 502, the waveguide structure 502 is positioned over the packaged semiconductor device 106 as depicted in FIG. 9.

Figure 10:
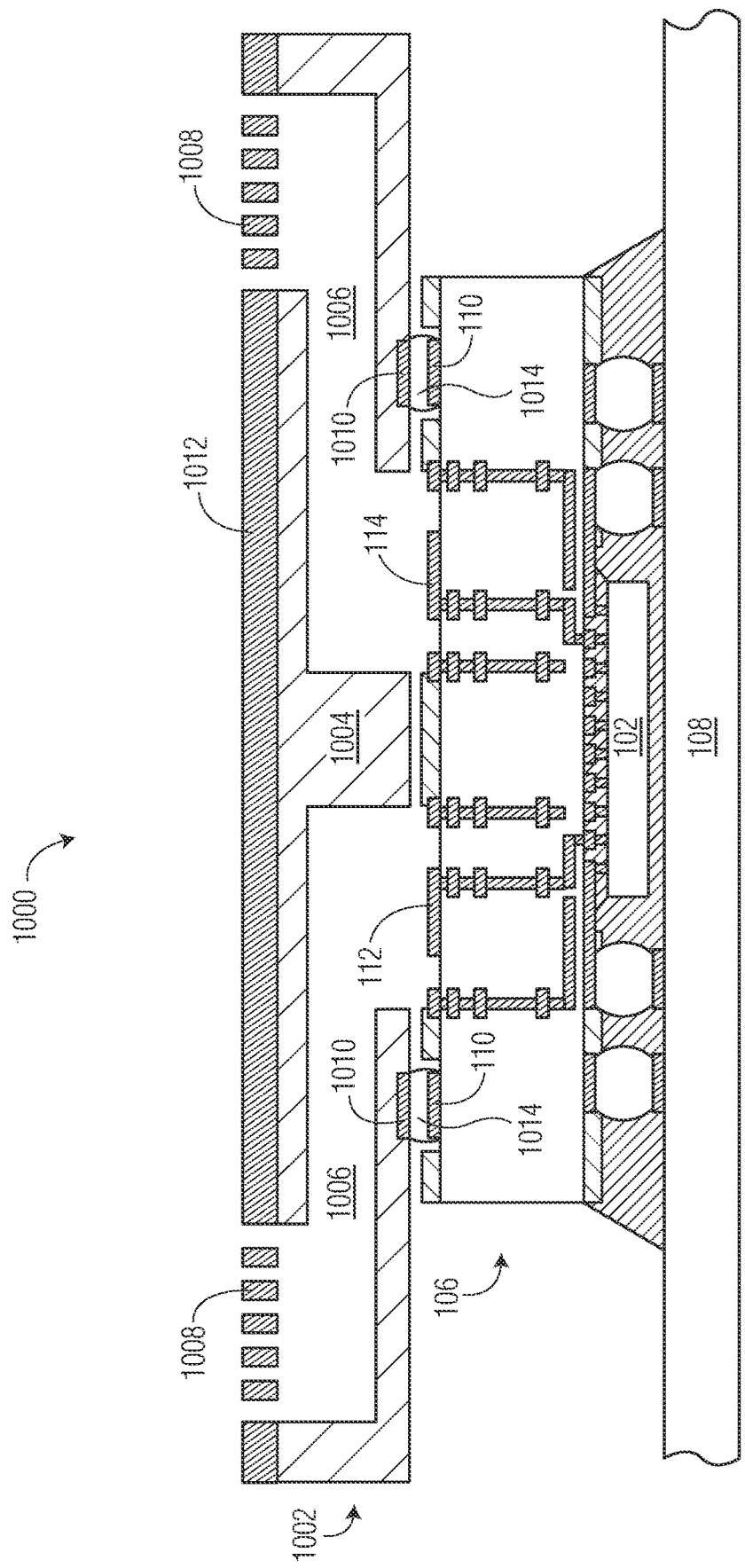
FIG. 10 through FIG. 12 illustrate, in simplified cross-sectional views, alternative example assemblies of a packaged semiconductor device and self-aligned waveguide at a stage of manufacture in accordance with an embodiment.

FIG. 10 illustrates, in a simplified cross-sectional view, an alternative example assembly 1000 of a packaged semiconductor device and self-aligned waveguide at a stage of manufacture in accordance with an embodiment. At this stage, the assembly 1000 includes an alternative waveguide structure 1002 finely aligned and affixed to the packaged semiconductor device 106 by way of reflowing solder material applied onto alignment features, for example. In this embodiment, solid solder bonds 1014 are formed between the alignment features 110 and waveguide alignment features 1010 properly aligning signal launchers 112 and 114 with respective waveguides 1006.

In this embodiment, the waveguide structure 1002 includes waveguides 1006 formed in a waveguide body 1004. Waveguide antennas 1008 are located at the top of the waveguides 1006 and may be formed from a metal layer 1012 at the top side of the waveguide structure 1002. In this embodiment, the waveguide structure 1002 may be characterized as an air cavity waveguide antenna. For example, the waveguide body 1004 may be formed from a metal or metal coated plastic material with the waveguides 1006 formed as air cavities. Waveguide alignment features 1010 are formed on the bottom side of the waveguide body 1004 to correspond with the alignment features 110 of the packaged semiconductor device 106. For example, the alignment features 1010 are formed as one or more metal pads having a solderable surface. The alignment features 1010 may be formed in a recessed portion on the bottom side of the waveguide body 1004 or may be formed as a plated portion on the bottom side of the waveguide body 1004. It may be desirable for the waveguide alignment features 1010 to be formed from similar surface materials and have similar shapes and sizes as the alignment features 110 of the packaged semiconductor device 106.

Figure 11:
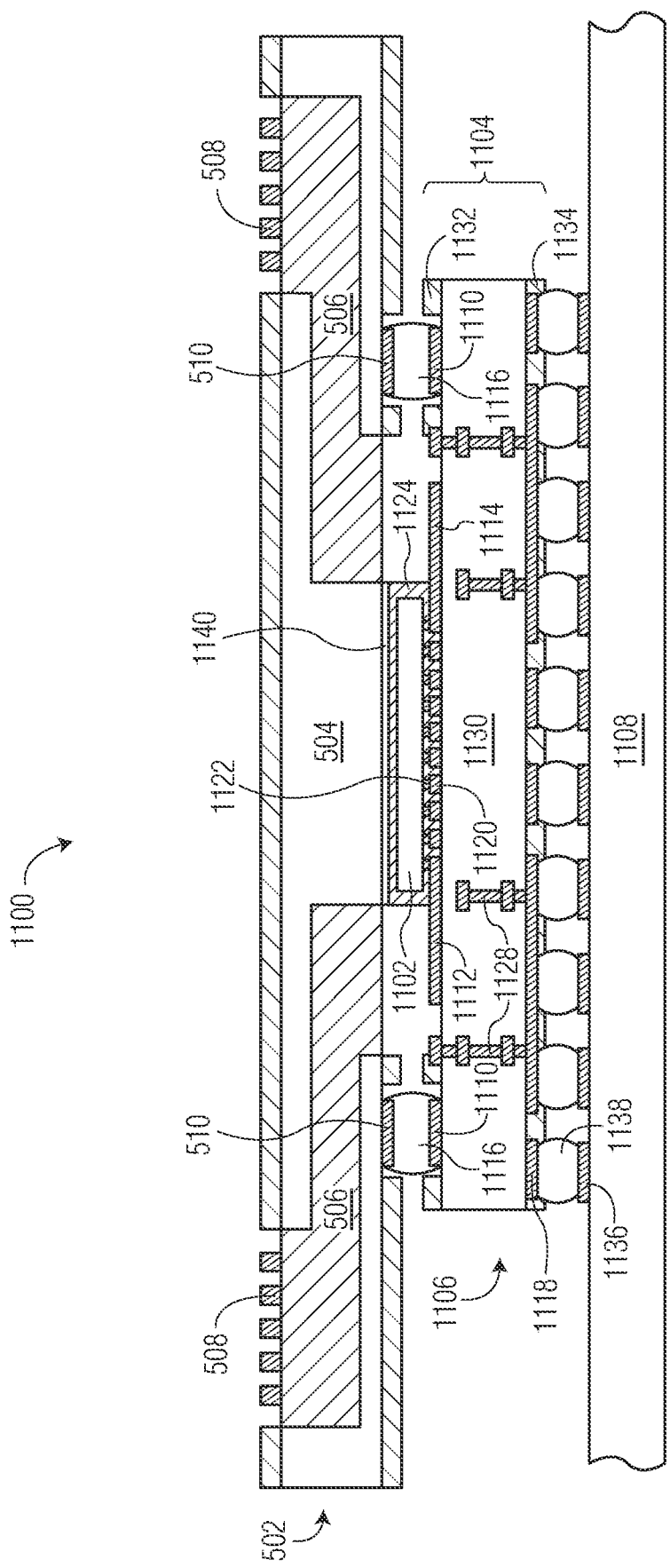

FIG. 11 illustrates, in a simplified cross-sectional view, an alternative example assembly 1100 of a packaged semiconductor device and self-aligned waveguide at a stage of manufacture in accordance with an embodiment. At this stage, the assembly 1100 includes the waveguide structure 502 finely aligned and affixed to an alternative packaged semiconductor device 1106 by way of reflowing solder material applied onto alignment features, for example. In this embodiment, solid solder bonds 1116 are formed between the alignment features 1110 and waveguide alignment features 510 properly aligning signal launchers 1112 and 1114 with respective waveguides 506.

In this embodiment, the packaged semiconductor device 1106 includes a semiconductor die 1102 affixed on a package substrate 1104 and interconnected to a PCB substrate 1108 by way of conductive connectors 1138. The semiconductor die 1102 is affixed at a top side of the package substrate 1104 in a flip-chip orientation and connected by way of conductive die connectors 1122 and conductive die connector pads 1120. In this embodiment, the semiconductor die 1102 and the region between the semiconductor die and the package substrate 1104 is encapsulated with an encapsulant (e.g., epoxy material) 1124. An interface material 1140 is disposed between the packaged semiconductor device 1106 and the waveguide structure 502. The interface material 1140 may be characterized as a thermal interface material configured to form a thermal conduction path between the semiconductor die 1102 and the waveguide body 504, for example. In this embodiment, the packaged semiconductor device 1106 is depicted as an example flip-chip chip scale package (CSP) package type.

The package substrate 1104 is formed as a multilayer laminate structure having conductive (e.g., metal) layers patterned to form conductive features such as alignment features 1110, signal launchers 1112 and 1114, connector pads 1118, and die connector pads 1120. In this embodiment, the alignment features 1110 are formed in the same processing step as the signal launchers 1112 and 1114, allowing for accurate control of the locations of the alignment features relative to the signal launchers. The conductive layers are separated from each another by a non-conductive material 1130 (e.g., FR-4) and interconnected by way of vias 1128, for example. The connector pads 1118 located at the bottom side of the package substrate 1104 are connected to corresponding PCB pads 1136 of the PCB substrate 1108 by way of the conductive connectors 1138, for example. Non-conductive (e.g., solder mask) layers 1132 and 1134 are formed on respective top side and the bottom side of the package substrate 1104. Openings are formed in non-conductive layers 1132 and 1134 exposing the signal launchers 1112 and 1114, alignment features 1110, and connector pads 1118, for example. In this embodiment, the alignment features 1110 are formed around an outer perimeter of the top side of the package substrate 1104. The alignment features 1110 are formed as one or more metal pads having a solderable surface.

In this embodiment, the signal launchers 1112 and 1114 are configured for propagation of radio frequency (RF) signals such as radar, Wi-Fi, UWB, 5G and 6G signals, for example. The conductive features of the package substrate 1104 and vias 1128 are configured and arranged to form a vertical conductive structure (e.g., wall, fence) connected around a perimeter of a conductive layer portion configured as a signal reflector. The vertical conductive structure substantially surrounds the signal launcher 1112 and serves as a waveguide cavity in the package substrate 1104, for example.

Figure 12:
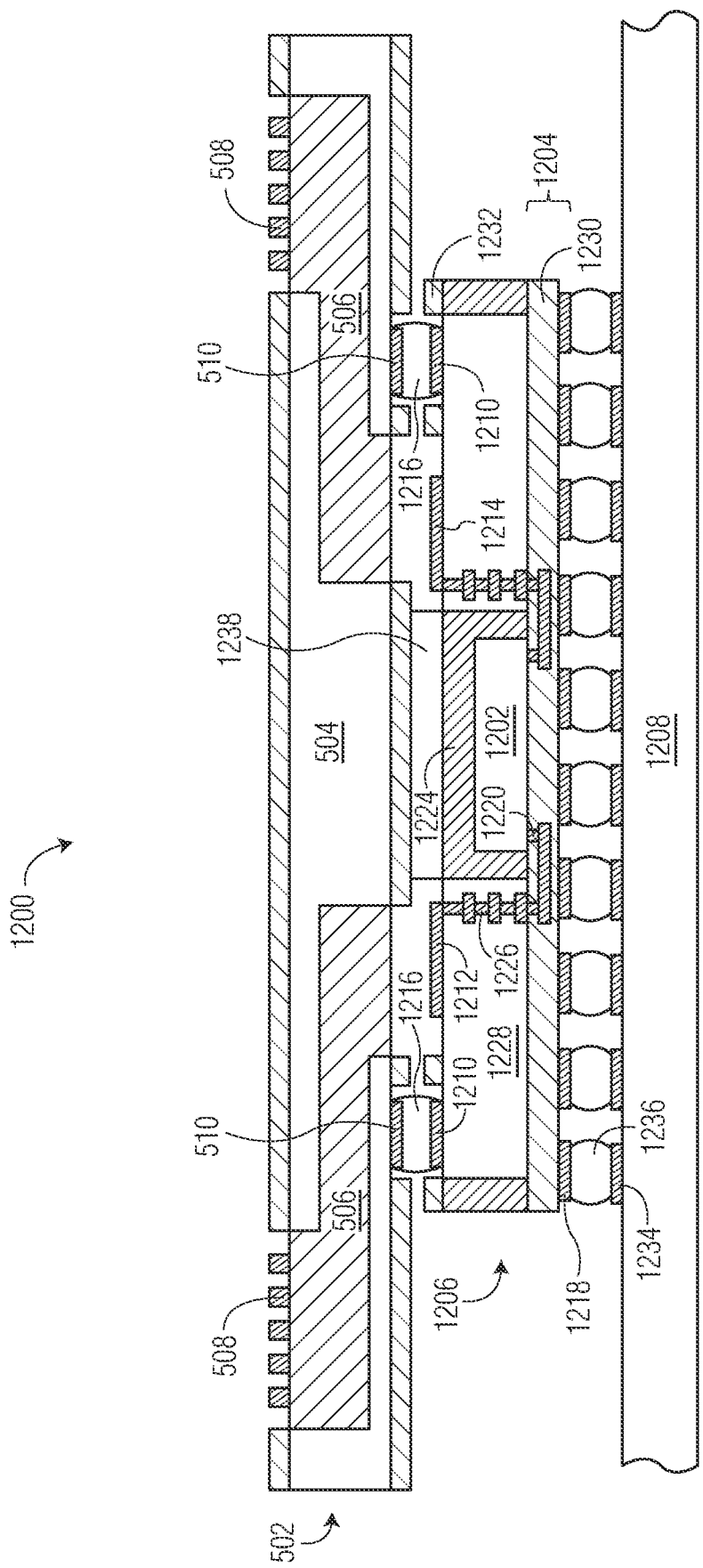

FIG. 12 illustrates, in a simplified cross-sectional view, an alternative example assembly 1200 of a packaged semiconductor device and self-aligned waveguide at a stage of manufacture in accordance with an embodiment. At this stage, the assembly 1200 includes the waveguide structure 502 finely aligned and affixed to an alternative packaged semiconductor device 1206 by way of reflowing solder material applied onto alignment features, for example. In this embodiment, solid solder bonds 1216 are formed between the alignment features 1210 and waveguide alignment features 510 properly aligning signal launchers 1212 and 1214 with respective waveguides 506.

In this embodiment, the packaged semiconductor device 1206 includes a semiconductor die 1202 and launcher structures encapsulated with an encapsulant 1224 on a package substrate 1204. The semiconductor die 1202 is affixed at a top side of the package substrate 1204 in an active-side-down orientation. An interface material 1238 is disposed between the packaged semiconductor device 1206 and the waveguide structure 502. The interface material 1238 may be characterized as a thermal interface material configured to form a thermal conduction path between the semiconductor die 1202 and the waveguide body 504, for example. The package substrate 1204 includes conductive features such as traces 1222 and contacts 1220 surrounded by non-conductive material 1230. The package substrate 1204 further includes other conductive features (not shown) configured to interconnect the semiconductor die 1202 with the PCB 1208 by way of the connector pads 1218, corresponding PCB pads 1234, and conductive connectors 1236. In this embodiment, the package substrate 1204 may be characterized as a redistribution layer (RDL) package substrate.

The launcher structures are each formed as a multilayer laminate structure having conductive features (e.g., metal or other conductive materials) separated by non-conductive material 1228 (e.g., FR-4, ceramic). The signal launchers 1212 and 1214 are formed at a top conductive layer of respective launcher structures. In this embodiment, the signal launchers 1212 and 1214 are configured for propagation of radio frequency (RF) signals such as radar, Wi-Fi, UWB, 5G and 6G signals, for example. Conductive features of the launcher structures and package substrate 1204 such as vias 1226, traces 1222, and contacts 1220 interconnect the semiconductor die 1202 with the signal launchers 1212 and 1214, for example. In this embodiment, the packaged semiconductor device 1206 is depicted as an example fan-out wafer-level package (WLP) package type.

The alignment features 1210 are formed around an outer perimeter of the top side of the packaged semiconductor device 1206. The alignment features 1210 are formed as one or more metal pads having a solderable surface. A non-conductive (e.g., solder mask) layer 1232 is formed on the top side of the packaged semiconductor device 1206. Openings are formed in non-conductive layer 1232 exposing the signal launchers 1212 and 1214 and alignment features 1210, for example. In this embodiment, the alignment features 1210 are formed in the same processing step as the signal launchers 1212 and 1214, allowing for accurate control of the locations of the alignment features relative to the signal launchers.

FIG. 13 illustrates, in simplified plan views, example alignment feature configurations 1300 in accordance with an embodiment. In the embodiments depicted above, the alignment features (e.g., alignment features 110 of FIG. 1) are formed around an outer perimeter of the top side of the packaged semiconductor device and matching waveguide alignment features (e.g., waveguide alignment features 510 of FIG. 5) are formed on the bottom side of the corresponding waveguide structure. For illustration purposes, the example alignment feature configurations 1300, as formed on the packaged semiconductor device, are shown as one or more metal pad configurations without reference to the packaged semiconductor device.

In this embodiment, a first example alignment feature 1302 is configured as a series of circular pads formed around the perimeter. A second example alignment feature 1304 is configured as a continuous pad formed around the perimeter. A third example alignment feature 1306 is configured as a set of 4 linear segment pads formed around the perimeter. A fourth example alignment feature 1308 is configured as a set of 4 corner-shaped (e.g., 90 degrees) pads formed around the perimeter. Each pad of the alignment feature examples 1300 is formed from a suitable metal material having a solderable surface or is plated to have a have a solderable surface. Each of the alignment feature examples 1300 is formed with a predetermined cross-sectional width. It is therefore desirable to coarsely align (e.g., within 50% of the cross-sectional width) the waveguide alignment features with the package alignment features for optimal self-aligning. In other embodiments, other alignment feature configurations, shapes, and sizes may be formed on the packaged semiconductor device, for example.

Figure 14:
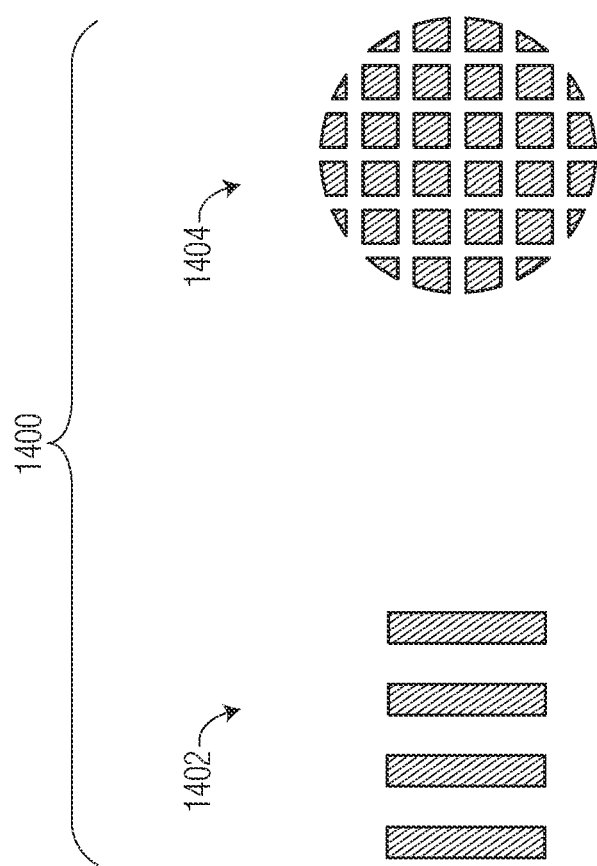
FIG. 14 illustrates, in a simplified plan view, example alignment feature pad configurations in accordance with an embodiment.

FIG. 14 illustrates, in simplified plan views, example alignment feature pad configurations 1400 in accordance with an embodiment. In the embodiments depicted above, the alignment features (e.g., alignment features 110 of FIG. 1) are formed around an outer perimeter of the top side of the packaged semiconductor device and matching waveguide alignment features (e.g., waveguide alignment features 510 of FIG. 5) are formed on the bottom side of the corresponding waveguide structure. The alignment features are formed as one or more metal pads having a solderable surface. The alignment features may be formed as one continuous pad around the perimeter or a plurality of pad segments distributed around the perimeter as depicted in the examples of FIG. 13.

In this embodiment, the alignment feature pads are configured to further enhance solder wetting during a reflow process. A first example alignment feature pad section 1402 is configured as a striped pad section providing more surface area for solder wetting. A second example alignment feature pad section 1404 is configured as a gridded pad section providing more surface area for solder wetting. Each of the example pad configurations may be applicable to the one continuous pad 1304 and to the plurality of pad segment 1302, 1306-1308 examples of FIG. 13. In other embodiments, other alignment feature pad configurations may be employed to further enhance solder wetting. In some embodiments, alignment feature pad configurations may be chosen based on alignment in a desired direction by way of solder wetting during the reflow process, for example.

Generally, there is provided, a method including forming a first alignment feature on a packaged semiconductor device; forming a second alignment feature on a waveguide structure; applying a solder material onto the first alignment feature or the second alignment feature; placing the waveguide structure onto the packaged semiconductor device such that the second alignment feature overlaps the first alignment feature; and reflowing the solder material to cause the waveguide structure to align with the packaged semiconductor device. A waveguide of the waveguide structure may be aligned with a signal launcher of the packaged semiconductor device after reflowing the solder material. The solder material may be formed as a solder paste or solder balls. The reflowing the solder material may cause the waveguide structure to align with the packaged semiconductor device within a predetermined tolerance. The first alignment feature and the second alignment feature may be configured to align the waveguide structure with the packaged semiconductor device in two directions. The first alignment feature may include one or more first metal pads having a solderable surface. The second alignment feature may include one or more second metal pads having a solderable surface, each of the one or more second metal pads configured to bond with a corresponding pad of the one or more first metal pads during the reflowing the solder material. The first alignment feature may be formed around an outer perimeter of a top side of the packaged semiconductor device. The first alignment feature may be substantially surrounded by a non-conductive material.

In another embodiment, there is provided, a method including forming a first alignment feature on a packaged semiconductor device; forming a second alignment feature on a waveguide structure; applying a solder material onto the first alignment feature or the second alignment feature; placing the waveguide structure onto the packaged semiconductor device such that the first alignment feature and the second alignment feature are coarsely aligned with one another; and reflowing the solder material to cause the waveguide structure to finely align with the packaged semiconductor device within a predetermined tolerance. A waveguide of the waveguide structure may be aligned with a signal launcher of the packaged semiconductor device after reflowing the solder material. The first alignment feature may include one or more first metal pads having a solderable surface. The second alignment feature may include one or more second metal pads having a solderable surface, each of the one or more second metal pads configured to bond with a corresponding pad of the one or more first metal pads during the reflowing the solder material. The first alignment feature may be formed around an outer perimeter of a top side of the packaged semiconductor device. The method may further include forming a non-conductive layer over a top side of the packaged semiconductor device, the first alignment feature exposed through an opening in the non-conductive layer.

In yet another embodiment, there is provided, an apparatus including a packaged semiconductor device including a semiconductor die; a signal launcher interconnected with the semiconductor die; and a first alignment feature formed at a top side of the packaged semiconductor device; and a waveguide structure including a waveguide; and a second alignment feature formed at a bottom side of the waveguide structure, the second alignment feature aligned with the first alignment feature by way of a solder connection. The first alignment feature may include a first metal pad having a solderable surface. The second alignment feature may include a second metal pad having a solderable surface, the second metal pad bonded with the first metal pad by way of the solder connection. The packaged semiconductor device may further include a non-conductive layer formed over the top side of the packaged semiconductor device, the first alignment feature exposed through an opening in the non-conductive layer. The waveguide structure may be affixed to the packaged semiconductor device by way of the solder connection.

By now, it should be appreciated that there has been provided a packaged semiconductor device with a self-aligned waveguide structure. Alignment features are formed around an outer perimeter of the top side of the packaged semiconductor device. Matching alignment features are formed on the bottom side of the waveguide structure. The alignment features are located with predetermined relationships to signal launchers of the packaged semiconductor device and waveguides of the waveguide structure. For example, the alignment features are formed in the same processing step as the signal launchers, controlling the location accuracy within the packaged semiconductor device. The alignment features are formed as one or more metal pads having a solderable surface. A solder material (e.g., solder paste, solder balls) is applied to the alignment features of the packaged semiconductor device or the waveguide structure, and the waveguide structure is coarsely aligned with the packaged semiconductor device. During a reflow process, the solder material wets the alignment features causing the waveguide structure to finely self-align with the packaged semiconductor device. Accordingly, the waveguides are brought into precise alignment with the signal launchers as a result of the self-align process. A solder bond at the alignment features affixes the waveguide structure onto the packaged semiconductor device thus forming an assembly. Because the waveguides and the signal launchers of the assembly are brought into precise self-alignment by way of the reflow process, improvements in performance, accuracy, reliability, and overall device costs can be realized.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   forming a first alignment feature on a packaged semiconductor device, the first alignment feature including one or more first metal pads having a solderable surface;
   forming a second alignment feature on a waveguide structure;
   applying a solder material onto the first alignment feature or the second alignment feature;
   placing the waveguide structure onto the packaged semiconductor device such that the second alignment feature overlaps the first alignment feature; and
   reflowing the solder material to cause the waveguide structure to align with the packaged semiconductor device.

2. The method of claim 1, wherein a waveguide of the waveguide structure is aligned with a signal launcher of the packaged semiconductor device after reflowing the solder material.

3. The method of claim 1, wherein the solder material is formed as a solder paste or solder balls.

4. The method of claim 1, wherein reflowing the solder material causes the waveguide structure to align with the packaged semiconductor device within a predetermined tolerance.

5. The method of claim 1, wherein the first alignment feature and the second alignment feature are configured to align the waveguide structure with the packaged semiconductor device in two directions.

6. The method of claim 1, wherein the second alignment feature includes one or more second metal pads having a solderable surface, each of the one or more second metal pads configured to bond with a corresponding pad of the one or more first metal pads during the reflowing the solder material.

7. The method of claim 1, wherein the first alignment feature is formed around an outer perimeter of a top side of the packaged semiconductor device.

8. The method of claim 1, wherein the first alignment feature is substantially surrounded by a non-conductive material.

9. A method comprising:
   forming a first alignment feature on a packaged semiconductor device, the first alignment feature including one or more first metal pads having a solderable surface;
   forming a second alignment feature on a waveguide structure;
   applying a solder material onto the first alignment feature or the second alignment feature;
   placing the waveguide structure onto the packaged semiconductor device such that the first alignment feature and the second alignment feature are coarsely aligned with one another; and
   reflowing the solder material to cause the waveguide structure to finely align with the packaged semiconductor device within a predetermined tolerance.

10. The method of claim 9, wherein a waveguide of the waveguide structure is aligned with a signal launcher of the packaged semiconductor device after reflowing the solder material.

11. The method of claim 9, wherein the second alignment feature includes one or more second metal pads having a solderable surface, each of the one or more second metal pads configured to bond with a corresponding pad of the one or more first metal pads during the reflowing the solder material.

12. The method of claim 9, wherein the first alignment feature is formed around an outer perimeter of a top side of the packaged semiconductor device.

13. The method of claim 9, further comprising forming a non-conductive layer over a top side of the packaged semiconductor device, the first alignment feature exposed through an opening in the non-conductive layer.

* * * * *